(12) United States Patent
Grossi et al.

(10) Patent No.: US 8,355,281 B2
(45) Date of Patent: Jan. 15, 2013

(54) FLASH MEMORY HAVING MULTI-LEVEL ARCHITECTURE

(75) Inventors: Alessandro Grossi, Milan (IT); Giulio Albini, Milan (IT); Anna Maria Conti, Milan (IT)

(73) Assignee: Micron Technology, Inc., Boise, ID (US)

( * ) Notice: Subject to any disclaimer, the term of this patent is extended or adjusted under 35 U.S.C. 154(b) by 339 days.

(21) Appl. No.: 12/764,060

(22) Filed: Apr. 20, 2010

(65) Prior Publication Data

US 2011/0255334 A1 Oct. 20, 2011

(51) Int. Cl.
*G11C 16/00* (2006.01)

(52) U.S. Cl. ......... 365/185.1; 365/51; 365/63; 365/130; 257/324; 438/261

(58) Field of Classification Search .................... 365/130
See application file for complete search history.

(56) References Cited

U.S. PATENT DOCUMENTS

| 6,839,260 | B2* | 1/2005 | Ishii ................................ 365/51 |
| 7,209,376 | B2* | 4/2007 | Saito et al. ...................... 365/63 |
| 7,330,369 | B2* | 2/2008 | Tran ............................... 365/151 |
| 7,692,959 | B2* | 4/2010 | Krusin-Elbaum et al. .... 365/163 |
| 7,936,622 | B2* | 5/2011 | Li et al. .......................... 365/200 |

OTHER PUBLICATIONS

U.S. Appl. No. 12/764,054, filed Apr. 20, 2010, 28 pages.
U.S. Appl. No. 12/764,063, filed Apr. 20, 2010, 27 pages.
Jung et al "Three Dimensionally Stacked NAND Flash Memory Technology Using Stacking Single Crystal Si Layers on ILD and TANOS Structure for Beyond 30nm Node" 2006 IEEE, pp. 1-4.
Hsu et al "Study of Sub-30nm Thin Film Transistor (TFT) Charge-Trapping (CT) Devices for 3D NAND Flash Application" 2009 IEEE, pp. 27.4.1-27.4.4.

* cited by examiner

*Primary Examiner* — Tan T. Nguyen
(74) *Attorney, Agent, or Firm* — Knobbe Martens Olson & Bear, LLP

(57) ABSTRACT

Subject matter disclosed herein relates to a multi-level flash memory and a process flow to form same.

17 Claims, 11 Drawing Sheets

FLASH MEMORY HAVING MULTI-LEVEL ARCHITECTURE

BACKGROUND

1. Field

Subject matter disclosed herein relates to a multi-level flash memory and a process flow to form same.

2. Information

Memory devices may be employed in many types of electronic equipment, such as computers, cell phones, PDA's, data loggers, games, and navigational gear, for example. Continuing demand for smaller and/or more capable electronic equipment may lead to a desire for smaller, higher density memory devices, which may involve small semiconductor feature sizes that approach lower boundaries associated with material and electronic behavior at atomic or molecular levels. Accordingly, approaches to increase memory density other than decreasing semiconductor feature sizes may involve new configurations, such as three-dimensional memory architecture. Such an approach, however, may involve a dramatic shift to new fabrication techniques and/or new process flows that may be relatively expensive to implement. Thus, there may be a desire for a three-dimensional memory architecture that may be fabricated using a process flow that is modified relatively little from that used to fabricate more familiar two-dimensional memory architecture.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
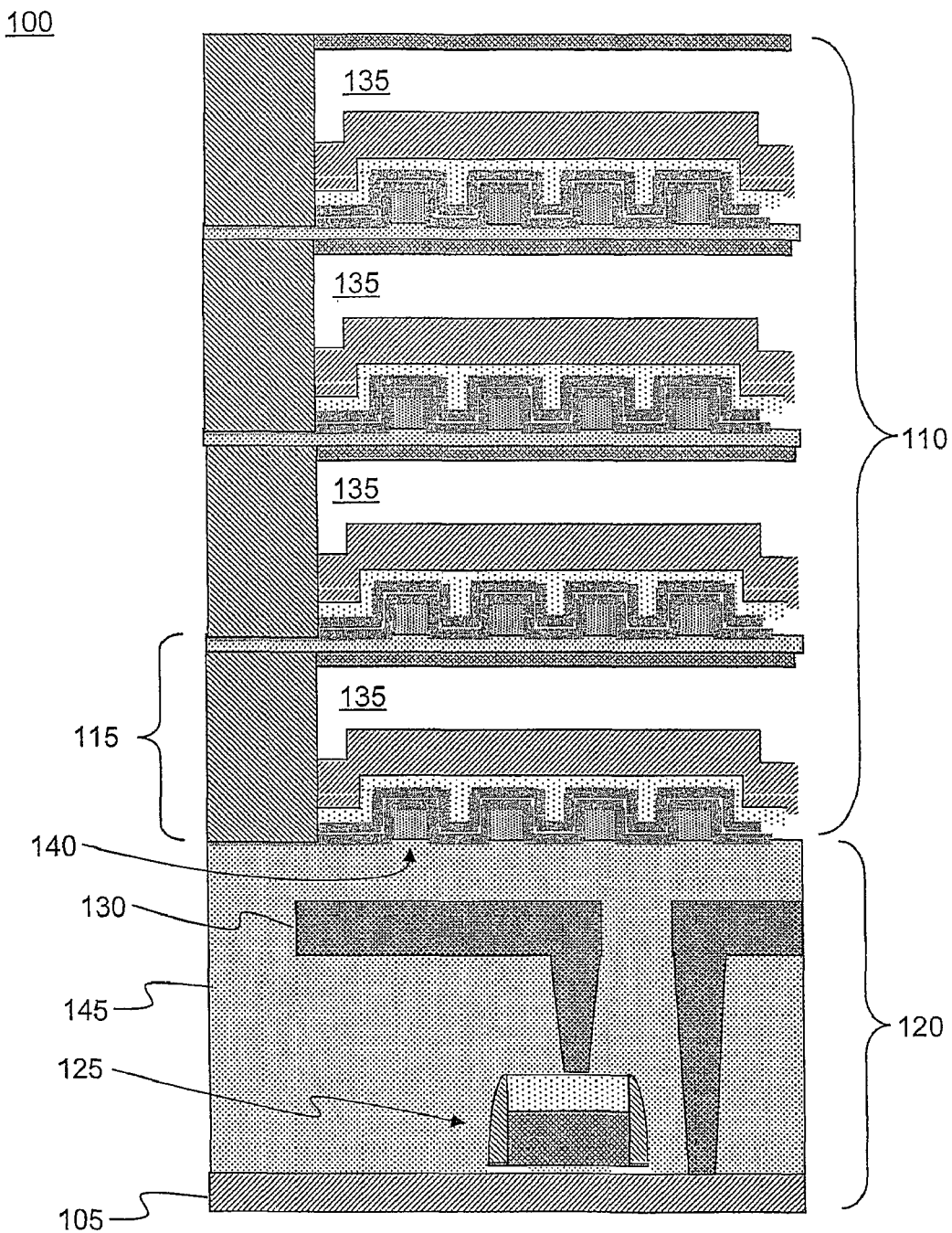
FIG. 1 is a cross-section view of a multi-level memory device, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a three-dimensional memory structure may comprise peripheral circuitry on a substrate, an interlayer dielectric layer (ILD) to cover the peripheral circuitry, and two or more levels of memory cell arrays on the ILD. Such an ILD may comprise, for example, silicon oxide deposited using various techniques including low pressure chemical vapor deposition (LPCVD), chemical vapor deposition (CVD), and/or atomic layer deposition (ALD). Such peripheral circuitry, for example, may comprise control circuitry to select and/or operate gate lines, bit lines, and/or drain-source lines, for example. Such peripheral circuitry may also comprise sense amplifier circuitry, though claimed subject matter is not so limited. Despite the name, peripheral circuitry need not reside on the periphery of a memory structure. In particular, such peripheral circuitry may be disposed between a substrate upon which the peripheral circuitry is built and two or more levels of memory cell arrays. In one implementation, such a three-dimensional memory structure may comprise a NAND flash memory, though claimed subject matter is not limited in this respect.

In an embodiment, an array of memory cells may comprise charge trap NAND flash memory. Such memory cells may comprise an oxide-nitride-oxide (ONO) stack to selectively trap charge carriers, and a channel region between source/drain regions. Source/drain contact with various levels of memory arrays may comprise a conductive plug that extends through the various levels of memory arrays. In a particular embodiment, a drain contact may extend from a topmost memory cell array level to a bottom-most memory cell array level.

In an embodiment, a process flow to fabricate a three-dimensional memory structure may begin by forming peripheral circuitry on a substrate. After covering peripheral circuitry with insulating material and/or an ILD, a first memory array level may be formed. After covering a first memory array level with further insulating material and/or an ILD, another memory array level may be formed, and so on. Contact lines to various memory array levels may then be formed as described below. Of course, such details of a process to fabricate a three-dimensional memory structure are merely examples, and claimed subject matter is not so limited.

In another embodiment, a process flow to fabricate a three-dimensional memory structure may begin by forming a first memory array level on a substrate. After covering a first memory array level with added insulating material and/or an ILD, another memory array level may be formed, and so on. After forming a last memory array level, peripheral circuitry may be formed on the substrate by selective removal of array ILD in a circuitry region. After covering peripheral circuitry with added insulating material and/or an ILD, conductive contact lines to various memory array levels may then be formed as described below. Again, such details of a process to fabricate a three-dimensional memory structure are merely examples, and claimed subject matter is not so limited.

Figure 2:
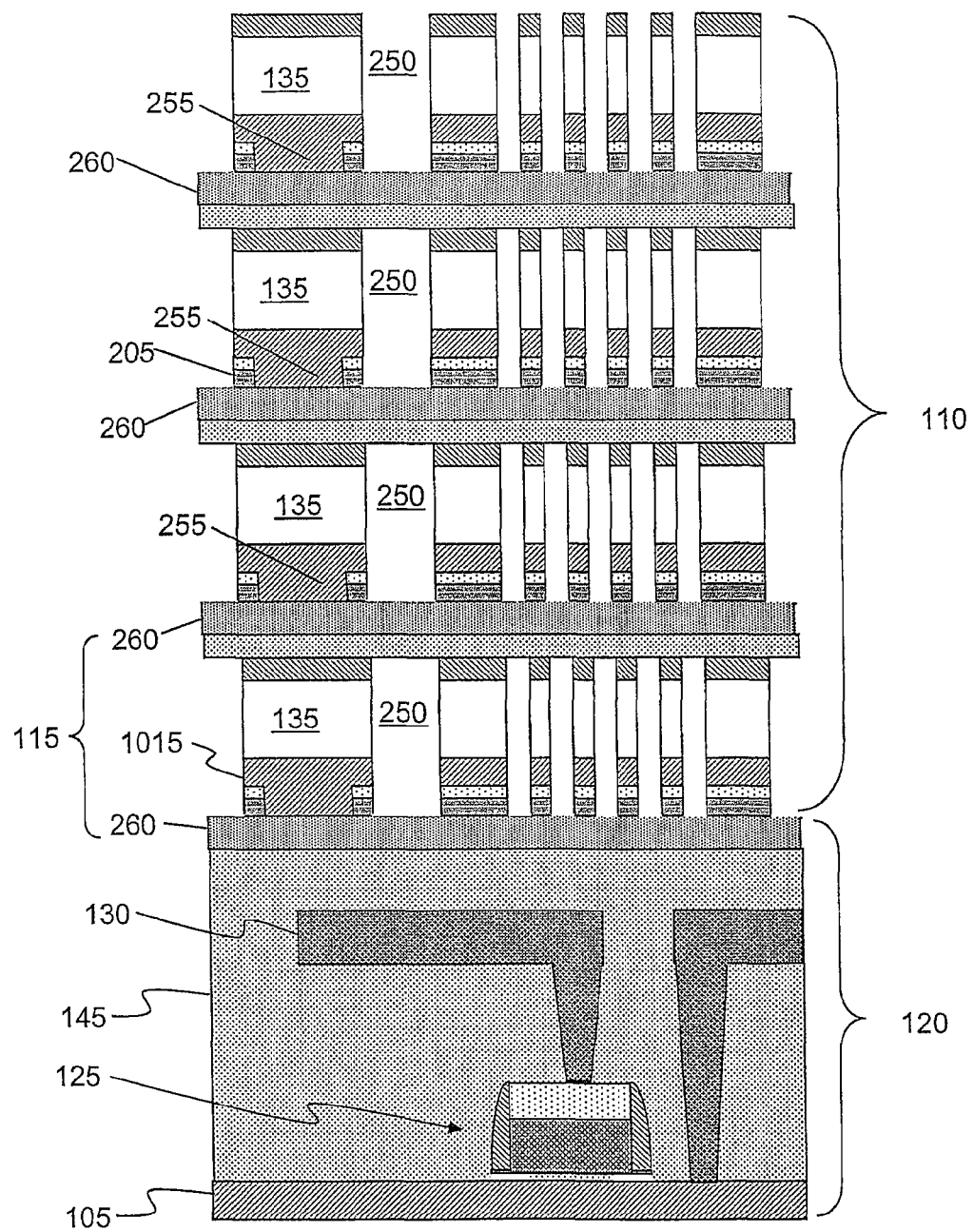
FIG. 2 is another cross-section view of a multi-level memory device, according to an embodiment.

FIG. 1 is a cross-section view of a multi-level memory device 100 in a first direction, according to an embodiment. FIG. 2 is another cross-section view of multi-level memory device 100 in a second direction, substantially orthogonal to the first direction, according to an embodiment. Such a three-dimensional memory device may allow relatively high-density packing of memory by stacking multiple array levels upon one another. Here, the word "stacking" is not meant to imply that such memory array levels are formed elsewhere and subsequently placed upon one another. Instead, such memory array levels may be fabricated in-situ over peripheral circuitry built into a substrate. For example, a lower portion of memory device 100 may comprise peripheral circuitry 120 on substrate 105, while an upper portion may comprise memory array stack 110. In particular, peripheral circuitry 120 may include one or more transistors 125 interconnected via various conductive lines 130 buried in ILD 145, for example. Memory array stack 110 may comprise one or more memory array levels 115 that include an array of memory cells 140. Adjacent memory array levels 115 may be insulated and/or separated from one another by at least ILD 135, though other materials and/or layers may be used. In a particular implementation, an ONO stack 205 may be etched in a particular region 255 on a polysilicon (poly) layer 260 to form a source contact 1015 in array levels 115. Polysilicon may be deposited using various techniques such as LPCVD, CVD, ALD and/or molecular beam epitaxy (MBE), for example, and doped in situ (e.g., during deposition) or implanted after deposition. Of course, such materials are merely examples, and claimed subject matter is not so limited.

Figure 3:
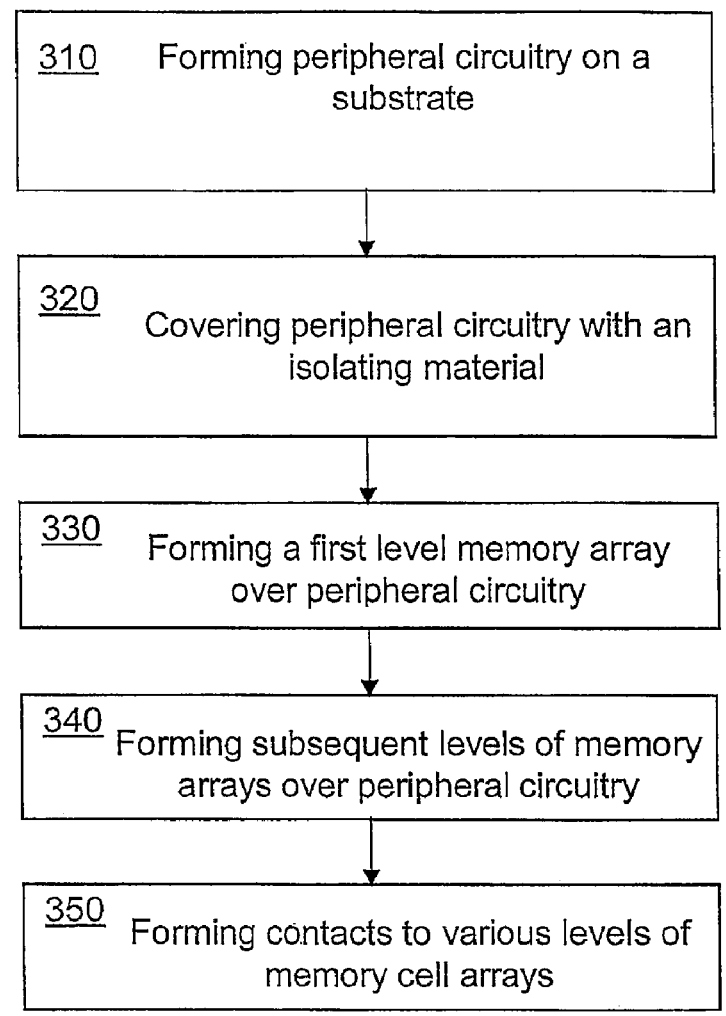
FIG. 3 is a flow diagram of a process to form a multi-level memory device, according to an embodiment.
Figure 4:
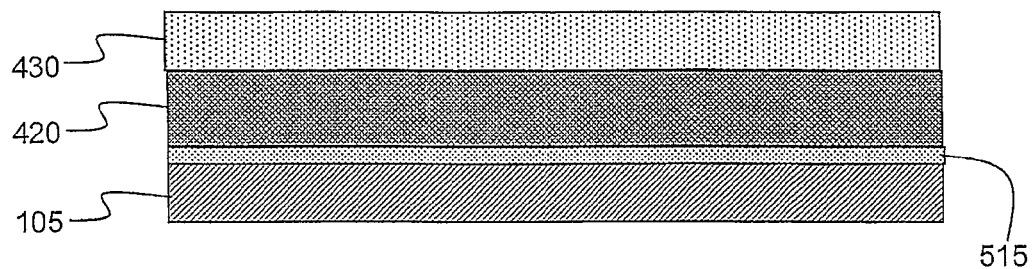
FIG. 4 is a cross-section view of gate stack layers of a transistor portion of a memory device, according to an embodiment.

FIG. 3 is a flow diagram of a process 300 to form a multi-level memory device, according to an embodiment. FIGS. 4-13 show cross-section views of such a multi-level memory device at various stages of fabrication. At block 310, a process of forming peripheral circuitry on a substrate may begin with substrate 105, as shown in FIG. 4. In particular, to define transistors included in peripheral circuitry, well/threshold implantations, high-voltage (HV) oxidation, low-voltage (LV) oxidation 515, and a poly layer deposition may be performed. Next, after defining shallow trench isolation (STI) with an oxide filling and subsequent chemical-mechanical polish (CMP), and a conductive layer 430 such as tungsten silicon (WSi$_2$), for example, may be deposited on substrate 105. Such a deposition process may include CVD, MBE, and/or ALD, for example.

Figure 5:
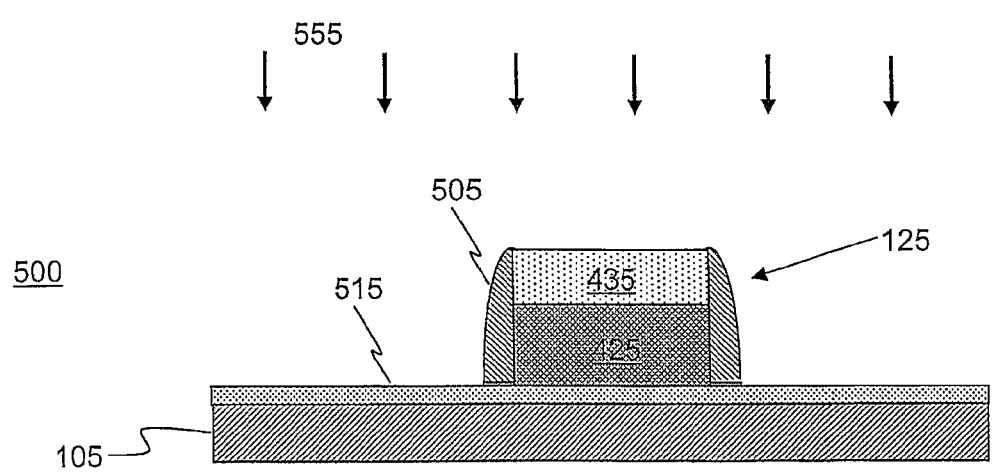
FIG. 5 is a cross-section view of a transistor portion of a memory device, according to an embodiment.

A mask may be deposited on structure 400 to pattern conductive layer 430 and at least a portion of poly layer 420. A resulting pattern may define multiple transistor gates of transistors included in peripheral circuitry 120, for example. Subsequent to transistor gate definition, LDD implants, spacer definition, and n+ and p+ implantation 555 may be performed near source/drain regions of such transistors. As shown in FIG. 5, resulting transistors 125 may comprise a gate stack including poly pattern 425 and conductive pattern 435 having sides covered by spacers 505. Transistors 125 may be used to control addressing and/or input/output operations of a memory device, for example.

Figure 6:
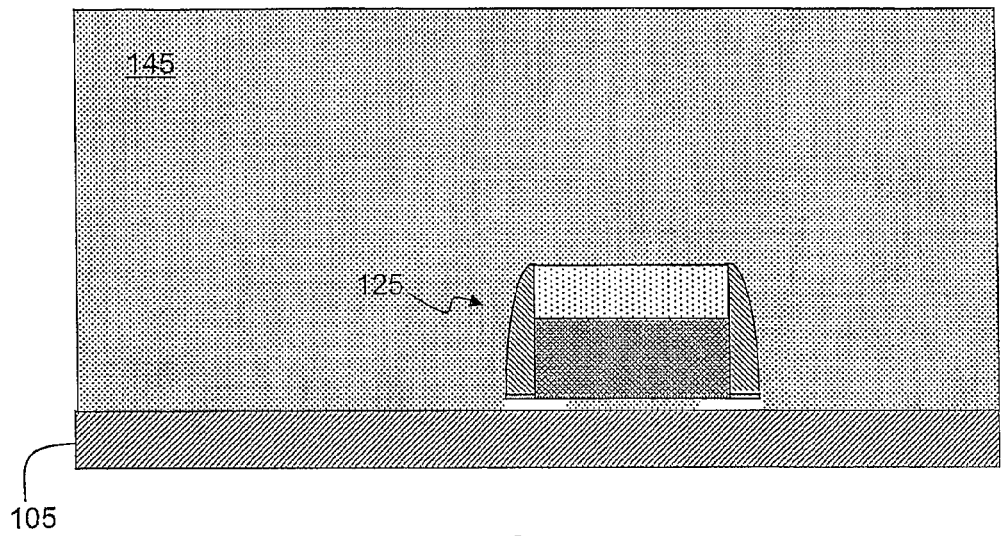
FIG. 6 is a cross-section view of a transistor portion of a memory device including an interlayer dielectric layer, according to an embodiment.
Figure 7:
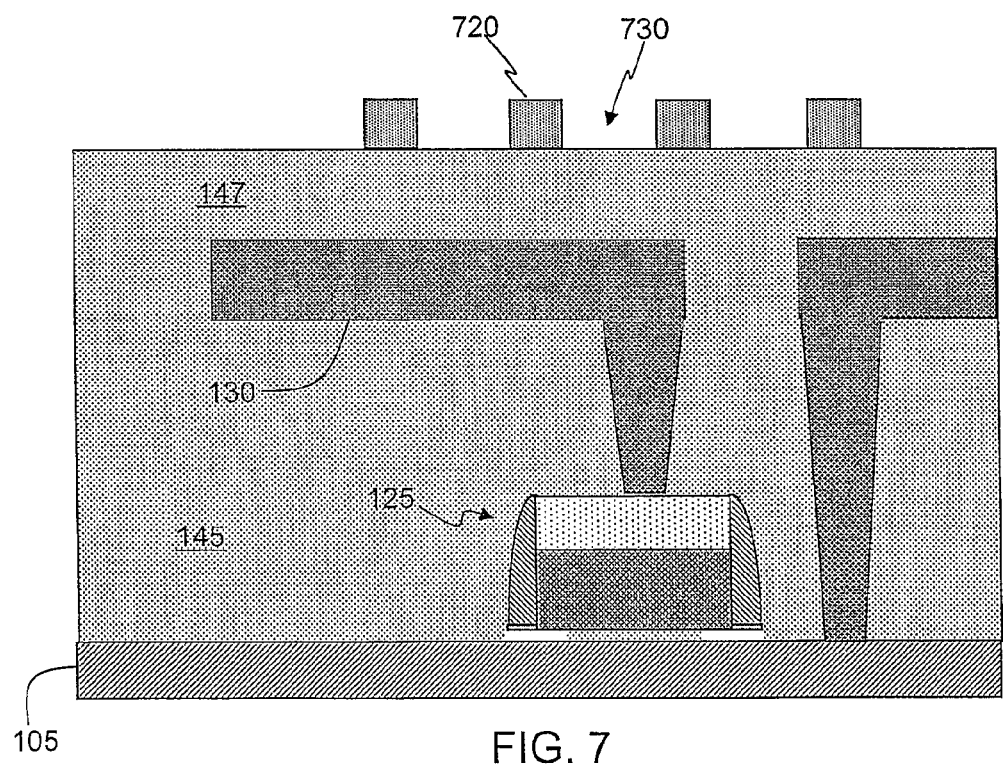
FIG. 7 is a cross-section view of a memory device prepared for fabricating a memory array, according to an embodiment.

FIG. 6 is a cross-section view of a transistor portion of a memory device including an ILD 145 encompassing transistor 125. A dielectric oxide, for example, may be deposited to cover substrate 105 and transistors 125 and subsequently polished via CMP, for example. Portions of resulting ILD 145 may be removed by etching to expose particular regions of transistors 125 for source/drain and/or gate contacts, for example. As shown in FIG. 7, such removed portions may be subsequently filled with a conductive material such as a metal to form conductive lines 130. In a particular implementation, such conductive lines may comprise tungsten, for example. A CMP process may then be used to polish a top portion of ILD 145 and conductive lines 130. At block 320 of process 300, additional ILD 147 may be deposited to cover conductive lines 130 and/or other portions of peripheral circuitry. At block 330, a first level memory cell array may begin to form by depositing a poly layer to cover ILD 147. Such a poly layer may be patterned and etched to form a poly pattern 720 that exposes regions 730 of ILD 147. In one implementation, poly pattern 720 may comprise substantially parallel multiple polysilicon lines that may correspond to bit lines of memory cells in a completed memory structure. Of course, such details of processes to form various portions of a memory device are merely examples, and claimed subject matter is limited in this respect.

Figure 8:
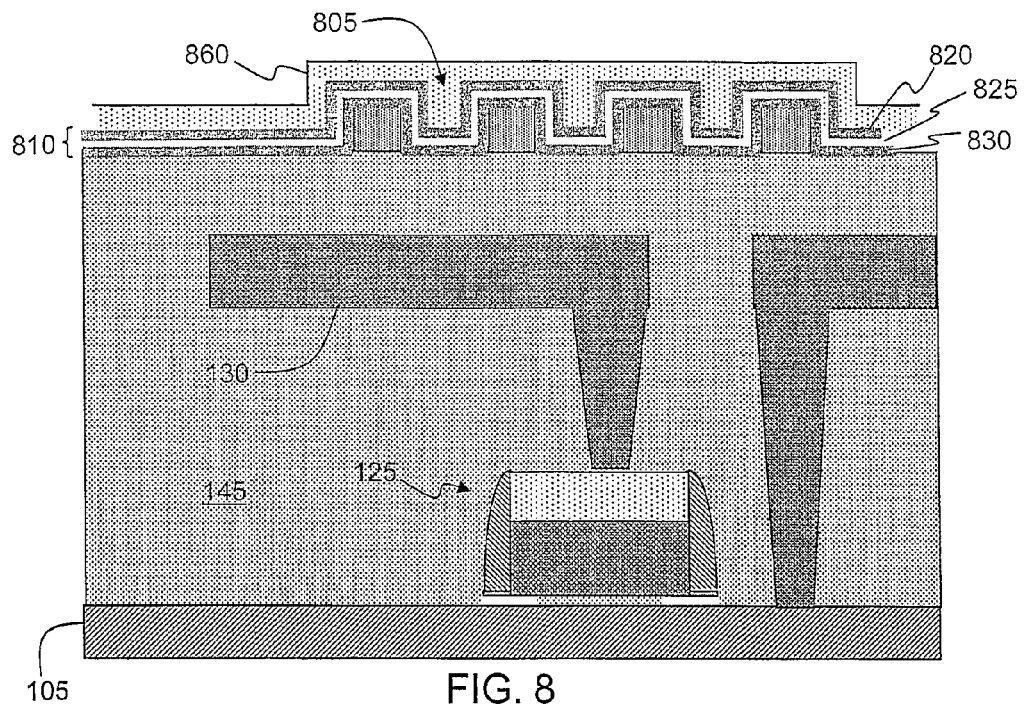
FIG. 8 is a cross-section view of a memory device including a memory array, according to an embodiment.
Figure 12:
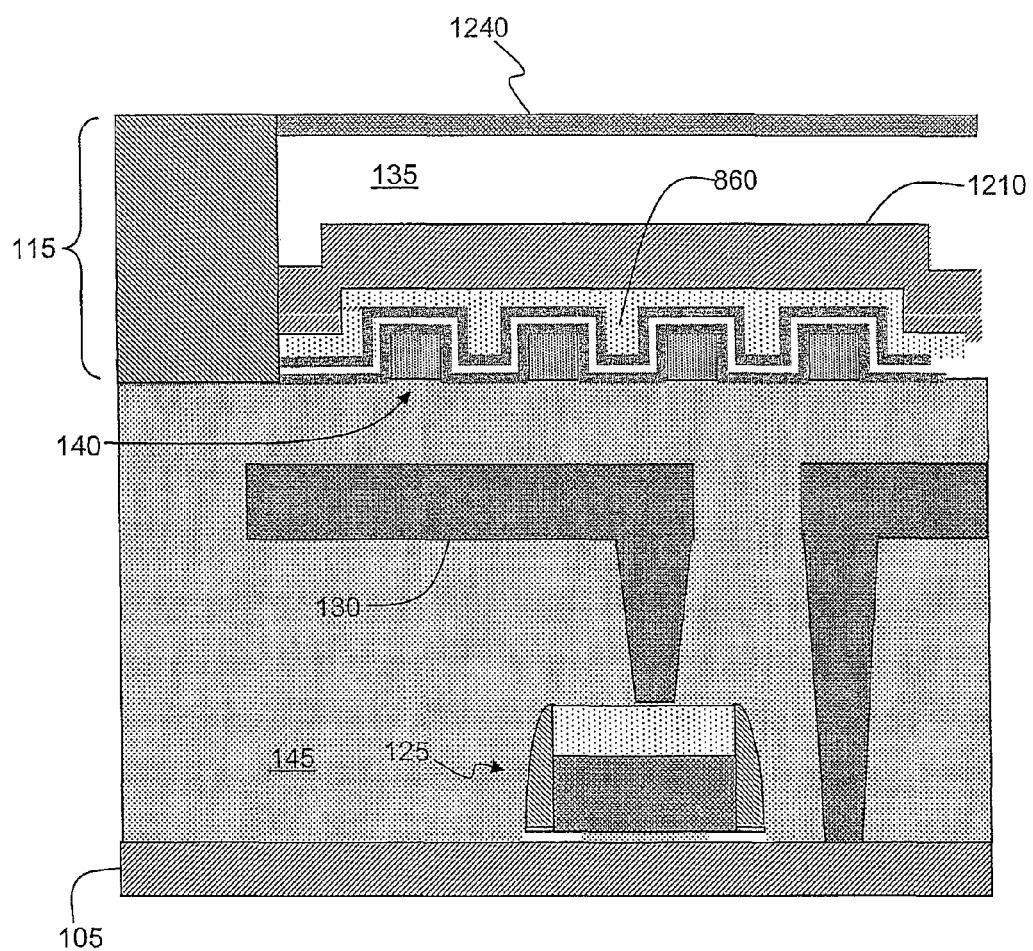
FIG. 12 is a cross-section view of a memory device prepared for fabricating a multi-level memory array, according to an embodiment.

Referring to FIG. 8, ONO 810 may be conformally deposited onto poly pattern 720. In particular, ONO 810 may comprise a blocking dielectric layer 820 (e.g., silicon oxide), a trapping dielectric layer 825 (e.g., silicon nitride), and a tunnel oxide layer 830 (e.g., silicon oxide). A metal cap 860 may be deposited to conformally cover ONO-covered poly pattern 720 and to fill intervening regions 805. Such a metal cap may comprise tantalum nitride (TaN), for example. As shown in FIG. 12, a low resistance metal layer 1210 may then be deposited to conformally cover resulting memory cells 140. Such a metal layer may comprise, for example, titanium, titanium nitride, tungsten (W), tungsten nitride (WN), tungsten silicide (WSi2), and/or a combination thereof. Of course, such materials are merely examples, and claimed subject matter is not so limited. In a particular implementation, ILD 135, which may comprise an oxide, may be conformally deposited onto low resistance metal layer 1210. An additional conformal nitride layer 1240 may cover ILD 135 and consequently form a foundation for which to fabricate a subsequent memory array level 115, for example, as at block 340.

Figure 9:
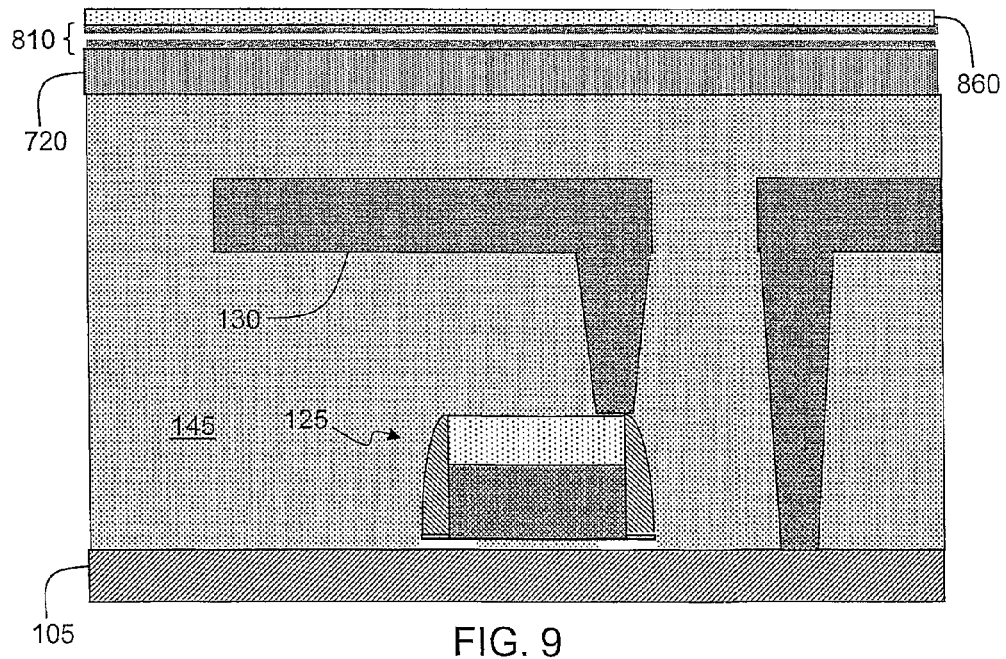
FIG. 9 is another cross-section view of a memory device including a memory array, according to an embodiment.
Figure 10:
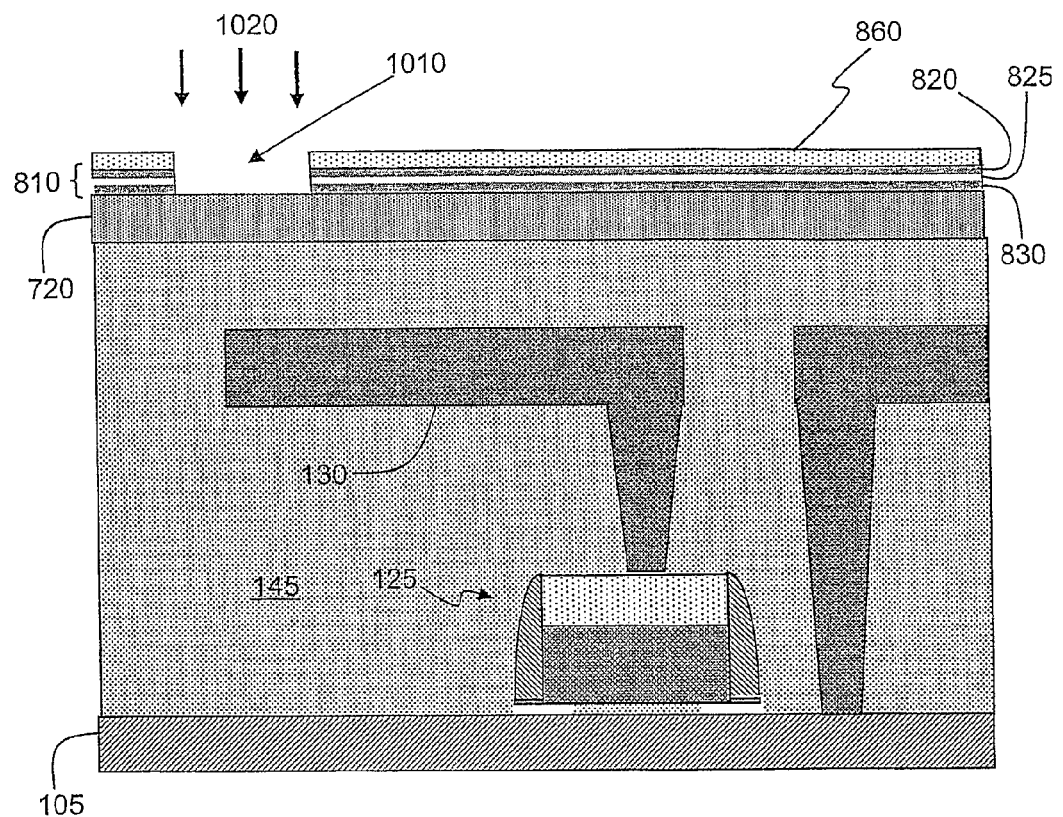
FIG. 10 is a cross-section view of a memory device prepared for fabricating a source contact, according to an embodiment.
Figure 11:
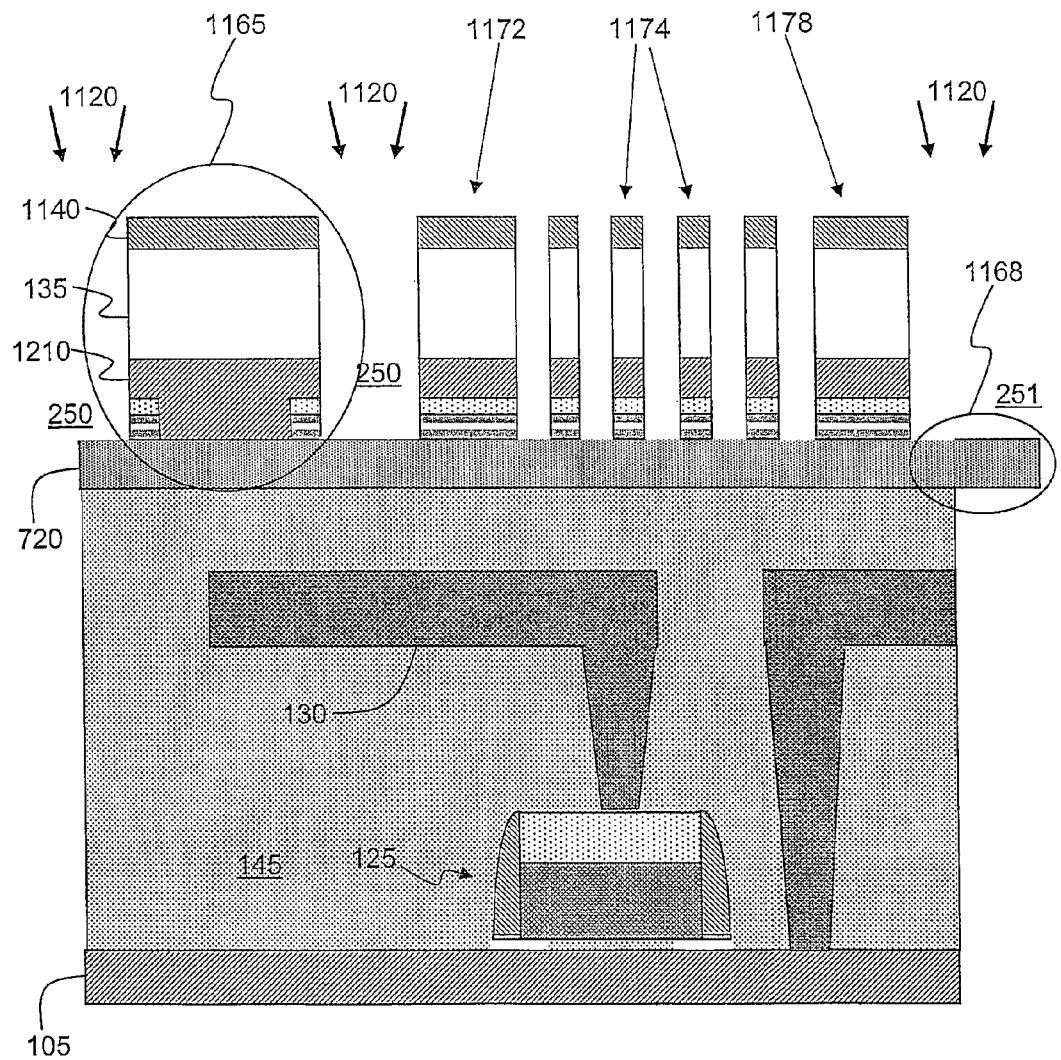
FIG. 11 is a cross-section view of a memory device, according to another embodiment.

FIG. 9 is a cross-section view substantially orthogonal to that of FIG. 8, according to an embodiment. In the cross-section view of FIG. 9, poly pattern 720 is shown to cover ILD 147. ONO 810 and metal cap 860 subsequently cover poly pattern 720. In a particular implementation, a portion of ONO 810 and metal cap 860 may be etched to expose a region 1010 of poly pattern 720, as shown in FIG. 10. Exposed region 1010 may then be subjected to carrier implantation such as n+ source implantation, for example. After such an implantation, low resistance metal layer 1210 may be deposited to fill and cover exposed region 1010 and to cover metal cap 860, as shown in FIG. 11. Such a conductive layer may comprise, for example, titanium, titanium nitride, tungsten, tungsten nitride, and/or a combination thereof. With such an approach, a source contact 1165 may be formed with cell patterning, and such an approach need not include a dedicated metallization process. Concurrently with cell patterning, a source selector transistor 1172, a drain selector transistor 1178, and gates 1174 may be formed. Further, contact straps for a source selector transistor (not shown), contact straps for a drain selector transistor (not shown), and contact straps for gates (not shown) may be formed. A drain contact (not shown) may be formed at region 1168. Of course, such materials are merely examples, and claimed subject matter is not so limited. A subsequent dielectric layer 135 may be deposited to cover low resistance metal layer 1210. Such a dielectric layer may comprise, for example, silicon oxide. A hard mask 1140, such as silicon nitride may be deposited on dielectric layer 135. Hard mask 1140 may subsequently be used to define word lines. A tilted source/drain implantation 1120 may be performed to dope source regions 250 and/or drain regions 251. Next, ILD deposition may be performed to fill spaces between gates. A planarization process may be performed using a selective process (e.g., ILD-removing-only process) up to hard mask 1140. At this stage, forming a new memory array level may begin with ILD deposition and a polysilicon deposition, for example.

Figure 13:
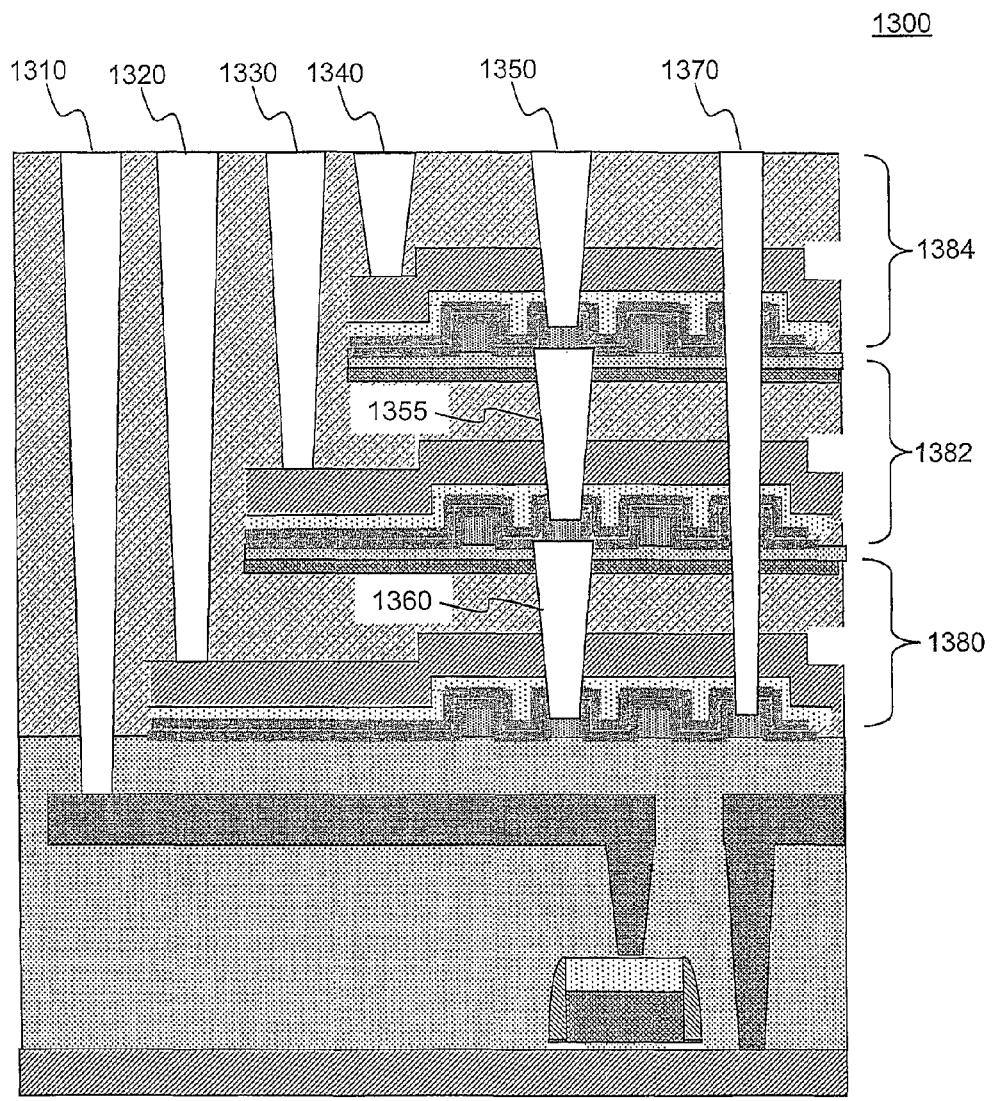
FIG. 13 is a cross-section view of drain or source contacts in a multi-level memory array, according to an embodiment.

FIG. 13 is a cross-section view of multi-level memory structure 1300 showing a variety of drain and/or source contacts, according to a number of embodiments. Such source/drain contacts may be formed during block 350 of process 300 in FIG. 3, to provide electrical connections among one or more levels of memory arrays, peripheral circuitry, and/or external circuitry such as a memory controller, for example. In one implementation involving periphery circuitry, strap source/word line contacts 1310, 1320, 1330, and 1340 may comprise plugs of a conductive material such as a metal. In particular, contact 1320 may electrically connect to a peripheral region of memory array level 1380, contact 1330 may electrically connect to a peripheral region of memory array level 1382, and contact 1340 may electrically connect to a peripheral region of memory array level 1384. In addition, contact 1310 may electrically connect to conductive lines 130, which may comprise a portion of peripheral circuitry, as discussed above. A technique to construct such contacts may involve an oxide-only etch process while selecting a proper etch depth in order to reach a particular memory array level. Subsequent to removing oxide by etching, resulting holes may be filled with a metal after which a CMP process may be performed, for example.

In an implementation involving drain contacts, a contact that extends beyond more than one memory array level may comprise a plurality of inter-level contacts that connect with one another via conductive plugs. Such drain contacts, for example, though claimed subject matter is not so limited. In a particular example, external circuitry (not shown) may connect to memory array level 1380 via inter-level contacts 1350, 1355, and 1360. A technique to construct such piece-wise contacts may involve a drain contact etch and fill process for individual memory array levels, adding a conductive plug using polysilicon, for example, and subsequently performing a planarization process (e.g., CMP). Thus, for example, inter-level contact 1360 may be formed after forming memory cell array level 1380 but before forming memory cell array level 1382. Similarly, inter-level contact 1355 may be formed after forming memory cell array level 1382 but before forming memory cell array level 1384, and so on.

In another implementation involving drain contacts, a contact that extends beyond more than one memory array level may comprise a single plug 1370 that extends from a topmost memory cell array level to a bottommost memory cell array level. Plug 1370 may comprise a drain contact for example. The relatively high aspect ratio inherent with single plug 1370 may introduce difficulties with etching and/or filling. Additionally, overlay management across multiple memory cell array levels may introduce difficulties for forming single plug 1370. For example, it may be difficult to align a mask on a surface above memory cell array level 1384 with a memory cell feature on memory cell array level 1380.

Corresponding bit lines (e.g., poly pattern 720) of respective memory array levels may be electrically shorted with one another using any of a variety of drain contact techniques.

Figure 14:
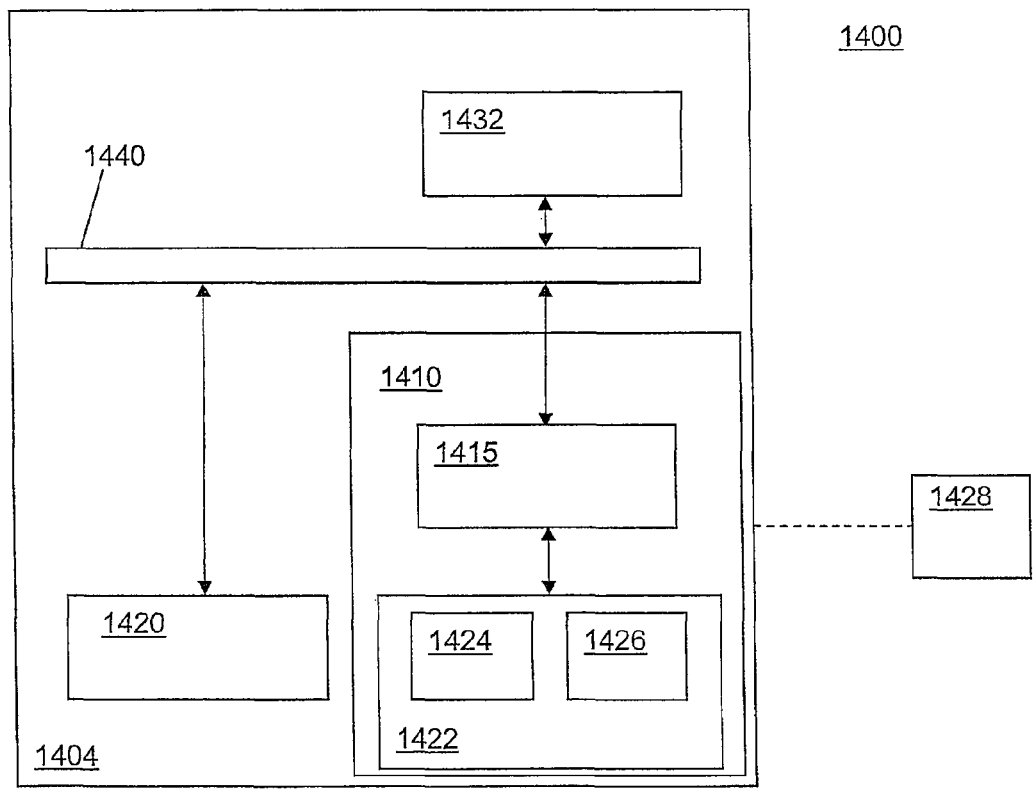
FIG. 14 is a schematic view of a computing system and a memory device, according to an embodiment.

FIG. 14 is a schematic view of a computing system and a memory device, according to an embodiment. Such a computing device may comprise one or more processors, for example, to execute an application and/or other code. For example, memory device 1410 may comprise a multi-level memory device 100 shown in FIG. 1. A computing device 1404 may be representative of any device, appliance, or machine that may be configurable to manage memory device 1410. Memory device 1410 may include a memory controller 1415 and a memory 1422. By way of example but not limitation, computing device 1404 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 1400, and the processes and methods as further described herein, may be implemented using or otherwise including hardware, firmware, software, or any combination thereof. Thus, by way of example but not limitation, computing device 1404 may include at least one processing unit 1420 that is operatively coupled to memory 1422 through a bus 1440 and a host or memory controller 1415. Processing unit 1420 is representative of one or more circuits configurable to perform at least a portion of a data computing procedure or process. By way of example but not limitation, processing unit 1420 may include one or more processors, controllers, microprocessors, microcontrollers, application specific integrated circuits, digital signal processors, programmable logic devices, field programmable gate arrays, and the like, or any combination thereof. Processing unit 1420 may include an operating system configured to communicate with memory controller 1415. Such an operating system may, for example, generate commands to be sent to memory controller 1415 over bus 1440. Such commands may comprise read and/or write commands. In response to a write command, for example, memory controller 1415 may provide a bias signal, such as a set or reset pulse to write information associated with the write command to a memory partition, for example. In an implementation, memory controller 1415 may operate memory device 1410, wherein processing unit 1420 may host one or more applications and/or initiate write commands to the memory controller to provide access to memory cells in memory device 1410, for example.

Memory 1422 is representative of any data storage mechanism. Memory 1422 may include, for example, a primary memory 1424 and/or a secondary memory 1426. Primary memory 1424 may include, for example, a random access memory, read only memory, etc. While illustrated in this example as being separate from processing unit 1420, it should be understood that all or part of primary memory 1424 may be provided within or otherwise co-located/coupled with processing unit 1420.

Secondary memory 1426 may include, for example, the same or similar type of memory as primary memory and/or one or more data storage devices or systems, such as, for example, a disk drive, an optical disc drive, a tape drive, a solid state memory drive, etc. In certain implementations, secondary memory 1426 may be operatively receptive of, or otherwise configurable to couple to, a computer-readable medium 1428. Computer-readable medium 1428 may include, for example, any medium that can carry and/or make accessible data, code, and/or instructions for one or more of the devices in system 1400.

Computing device 1404 may include, for example, an input/output 1432. Input/output 1432 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 1432 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method of fabricating a memory device, the method comprising:
    forming peripheral circuitry on a substrate;
    covering said peripheral circuitry and said substrate with an interlayer dielectric layer; and
    forming a stack of one or more levels of memory arrays on said interlayer dielectric layer, wherein forming a first level of said one or more levels of memory arrays comprises:
        at least partially covering said interlayer dielectric layer with a polysilicon thin film;
        patterning a portion of said polysilicon thin film to form substantially parallel multiple polysilicon lines;
        at least partially covering said polysilicon thin film and said multiple polysilicon lines with an oxide-nitride-oxide (ONO) stack; and
        at least partially covering said ONO stack with a metal layer.

2. The method of claim 1, further comprising:
    exposing said polysilicon thin film by removing a portion of said metal layer and said ONO stack to define parallel gate lines.

3. The method of claim 1, further comprising:
    exposing said polysilicon thin film by removing a portion of said metal layer and said ONO stack; and
    replacing said removed portion of said metal layer and said ONO stack with a conductive material to form a source contact.

4. The method of claim 1, further comprising:
    forming a first drain contact between two consecutive memory array levels;
    aligning a polysilicon line of one of said two consecutive memory array levels on said first drain contact; and
    forming a second drain contact between said polysilicon line and a third consecutive memory array level.

5. The method of claim 1, further comprising:
    after forming said one or more memory array levels, forming a drain contact among said memory array levels.

6. The method of claim 1, wherein said memory arrays comprise charge trap NAND memory cell arrays.

7. A memory device comprising:
    peripheral circuitry on a substrate;
    an interlayer dielectric layer to cover said peripheral circuitry; and
    one or more levels of memory arrays formed on said interlayer dielectric layer, wherein said peripheral circuitry is disposed between said substrate and said interlayer dielectric layer, the one or more levels of memory arrays comprising:
        a polysilicon thin film to at least partially cover said interlayer dielectric layer;
        an oxide-nitride-oxide (ONO) stack and a metal layer to at least partially cover said polysilicon thin film;
        an opening in a portion of said ONO stack and said metal layer to expose a portion of said polysilicon thin film; and
        a source contact disposed in said opening.

8. The memory device of claim 7, wherein said one or more levels of memory arrays cover at least a portion of said peripheral circuitry.

9. The memory device of claim 7, wherein said memory arrays comprise said ONO stack to trap charge carriers in individual memory cells.

10. The memory device of claim 7, further comprising:
    a first drain contact between two consecutive memory array levels; and
    a second drain contact between a poly silicon bit line of one of said two consecutive memory array levels and a third consecutive memory array level.

11. The memory device of claim 7, further comprising:
    a drain contact extending across two or more said memory array levels.

12. The memory device of claim 7, further comprising parallel gate lines on said one or more levels of memory arrays.

13. The memory device of claim 7, wherein said memory arrays comprise charge trap NAND memory cell arrays.

14. A system comprising:
    a memory device comprising:
        peripheral circuitry on a substrate;
        an interlayer dielectric layer to cover said peripheral circuitry; and
        one or more levels of memory arrays on said interlayer dielectric layer, the one or more levels of memory array comprising:
            a polysilicon thin film to at least partially cover said interlayer dielectric layer;
            an oxide-nitride-oxide (ONO) stack and a metal layer to at least partially cover said ONO stack;
            an opening in a portion of said ONO stack and said metal layer to expose a portion of said polysilicon thin film; and
            a source contact disposed in said opening;
    a memory controller to operate said memory device, and
    a processor to host one or more applications and to initiate write commands to said memory controller to provide access to memory cells in said memory arrays.

15. The system of claim 14, wherein said memory device further comprises:
    a first drain contact between two consecutive memory array levels; and
    a second drain contact between a poly silicon bit line of one of said two consecutive memory array levels and a third consecutive memory array level.

16. The system of claim 14, wherein said memory device further comprises:
    a drain contact extending across two or more said memory array levels.

17. The system of claim 14, wherein said memory arrays comprise charge trap NAND memory cell arrays.

* * * * *